US007336086B2

(12) United States Patent
Donze et al.

(10) Patent No.: US 7,336,086 B2
(45) Date of Patent: Feb. 26, 2008

(54) MEASUREMENT OF BIAS OF A SILICON AREA USING BRIDGING VERTICES ON POLYSILICON SHAPES TO CREATE AN ELECTRICAL OPEN/SHORT CONTACT STRUCTURE

(75) Inventors: Richard Lee Donze, Rochester, MN (US); Karl Robert Erickson, Rochester, MN (US); William Paul Hovis, Rochester, MN (US); John Edward Sheets, II, Zumbrota, MN (US); Jon Robert Tetzloff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/559,949

(22) Filed: Nov. 15, 2006

(65) Prior Publication Data
US 2007/0102700 A1 May 10, 2007

Related U.S. Application Data

(62) Division of application No. 10/944,625, filed on Sep. 17, 2004, now Pat. No. 7,183,780.

(51) Int. Cl.
*G01R 31/26* (2006.01)
*H01L 23/58* (2006.01)
*H01L 21/66* (2006.01)

(52) U.S. Cl. .................... 324/719; 324/765; 257/48; 438/14

(58) Field of Classification Search ............... 324/719, 324/765; 257/48; 438/14
See application file for complete search history.

(56) References Cited

U.S. PATENT DOCUMENTS

| | | | |
|---|---|---|---|
| 4,983,544 A | 1/1991 | Lu et al. | |
| 5,699,282 A | 12/1997 | Allen et al. | |
| 6,268,630 B1 | 7/2001 | Schwank et al. | |
| 6,461,880 B1 | 10/2002 | Tsiang | |
| 6,468,899 B1 | 10/2002 | Choi | |
| 6,593,217 B1 | 7/2003 | Fujisawa | |
| 2003/0127690 A1* | 7/2003 | Bryant et al. | 257/347 |

* cited by examiner

*Primary Examiner*—Anjan Deb
*Assistant Examiner*—Amy He
(74) *Attorney, Agent, or Firm*—Robert R. Williams

(57) ABSTRACT

An apparatus and method are disclosed for measuring bias of polysilicon shapes relative to a silicon area wherein the presence of an electrical coupling is used to determine the presence of bias. Bridging vertices on the polysilicon shapes are formed. Bridging vertices over the silicon area create low resistance connections between those bridging vertices and the silicon area; other bridging vertices over ROX (recessed oxide) areas do not create low resistance connections between those other bridging vertices and the silicon area. Determining which bridging vertices have low resistance connections to the silicon area and how many bridging vertices have low resistance connections to the silicon area are used to determine the bias of the polysilicon shapes relative to the silicon area.

3 Claims, 16 Drawing Sheets

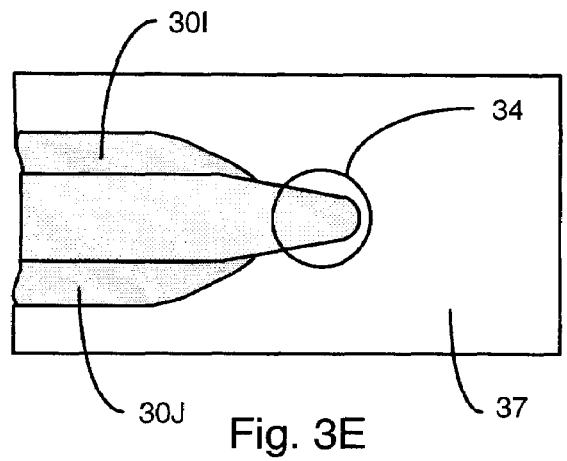
Fig. 3E
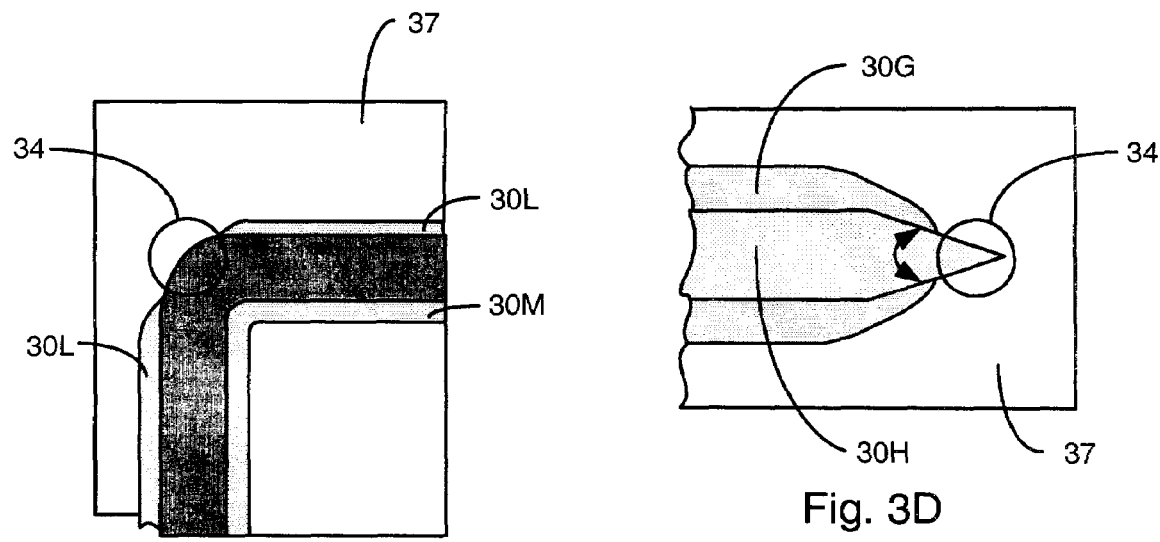
Fig. 3F
Fig. 3D

Fig. 11

| A | B | C | D | E |
|---|---|---|---|---|
| EXAMPLES | SHORT/OPEN TEST RESULTS (LEFT) +10 THRU -10 GRID POINTS | SHORT/OPEN TEST RESULTS (RIGHT) -10 THRU +10 GRID POINTS | BIAS RESULT | ALIGNMENT |
| CASE 1: IDEAL CASE | 00000111111 | 11111100000 | NO BIAS | PROPERLY ALIGNED |
| CASE 2: UNALIGNED, NO BIAS | 00000000011 | 11111111110 | NO BIAS | POLYSILICON SHIFTED LEFT BY 4 GRID POINTS |
| CASE 3: UNALIGNED, BIAS PRESENT | 11111111111 | 11111000000 | BIAS IS +4 | POLYSILICON SHIFTED RIGHT 3 GRID POINTS |
| CASE 4: INCONSISTENT, UNUSABLE | 10000100011 | 01101001100 | RESULTS UNUSABLE | RESULTS UNUSABLE |

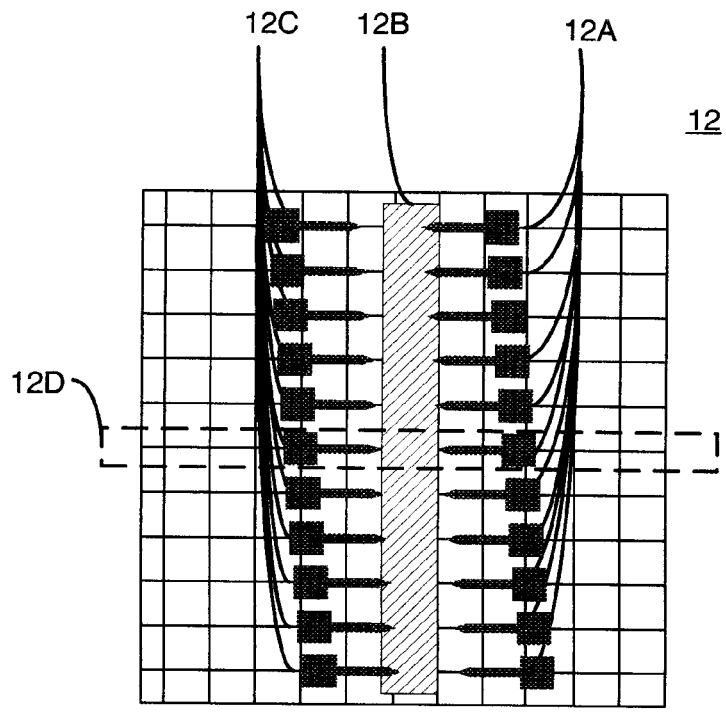

Fig. 12

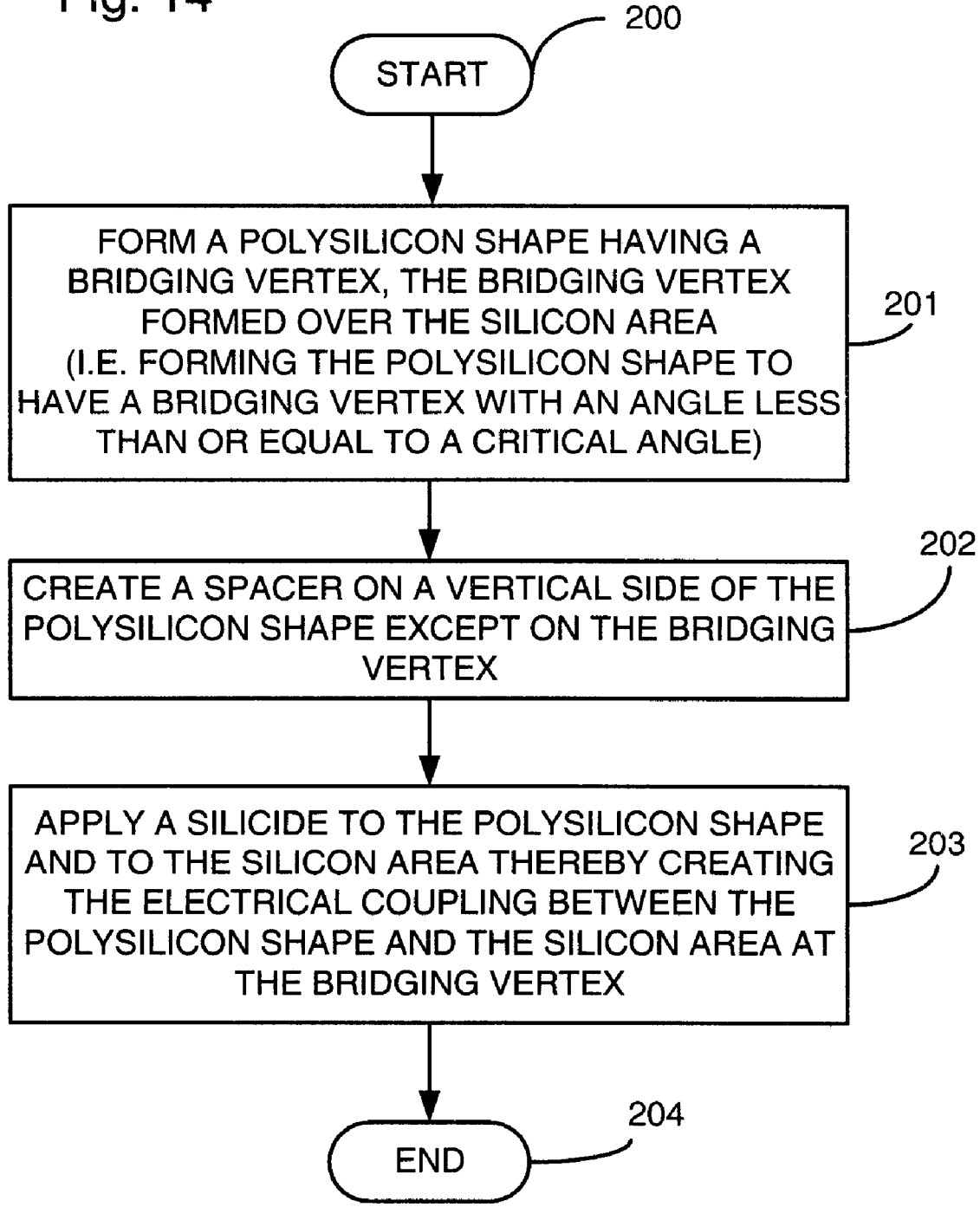

MEASUREMENT OF BIAS OF A SILICON AREA USING BRIDGING VERTICES ON POLYSILICON SHAPES TO CREATE AN ELECTRICAL OPEN/SHORT CONTACT STRUCTURE

CROSS-REFERENCE TO RELATED APPLICATIONS

This patent application is a divisional of a patent application of the same title, Ser. No. 10/944,625 filed on Sep. 17, 2004, now U.S. Pat. No. 7,183,780 issued on Feb. 27, 2007, which is incorporated herein by reference.

BACKGROUND OF THE INVENTION

1. Field of the Invention

The current invention generally relates to integrated circuit design and fabrication. More specifically, the current invention relates to silicide semiconductor production processes.

2. Description of the Related Art

Continuous improvements in the design and fabrication of microelectronic devices have led to smaller and faster computing devices capable of solving increasingly complex problems. Rapid gains in the performance of these devices have enabled technology users to solve increasingly complex problems. However, increasingly complex problems have demanded larger amounts of computing power, and as a result, more microelectronic devices such as field effect transistors (FETs) are needed to perform the necessary computations. Moreover, while the demand for computing power has increased the transistor counts on computer chips, physical chip size has been reduced or held constant thus complicating design and fabrication processes.

Semiconductor chips are composed of several basic elements: a collection of active components such as FETs, signal conductors such as metal or suitably doped polysilicon that transmit electrical signals between these components, and insulating (or "dielectric") material that separates the metal traces from one another. To produce consistent batches of computer chips, a formal production process is employed containing four high-level steps: microlithography, implantation, deposition and etching. Modern computer chips currently contain millions of transistors that are printed during the microlithography stage using a light source that ranges in wavelength from 130 to 90 nanometers. Each transistor is then implanted with, e.g., boron or phosphorous to effectively dope the transistor creating a device capable of behaving as a conductor or an insulator based on its electrical properties and the voltage applied. The ability to switch between a conductor and an insulator facilitates the binary behavior necessary for modern computing. Reducing the size of the field effect transistor lowers the voltage necessary to switch between a conductor and an insulator. Furthermore, smaller FETs that require less voltage also require less time to switch. Thus, it is desirable to create smaller FETs because of the performance gains and cost savings resulting from smaller feature sizes.

The production methods used to fabricate field effect transistors are well known in the art of manufacturing microelectronic devices. The methods known are expensive processes that require a significant number of steps and generally require over a month to complete. In a mass production environment, eliminating one or more steps can result in expense savings and increased profits for both the manufacturer and the consumer. As a result, large amounts of research and development are directed at eliminating steps of the fabrication process and improving the design of FETs.

Referring to FIG. 1, a silicon on insulator FET is comprised of a polysilicon shape 8 positioned on a silicon substrate patterned with oxide areas and doped silicon areas. Portions of the silicon have been doped and comprise a source 5 and a drain 6 of the FET, which are individually positioned on either side of the polysilicon shape 8. The electrical signal generated by the switching of the FET is transmitted through separate couplings created on both the source 5 and the drain 6. These couplings historically use vias, which are holes formed in the layers of the chip. The vias are filled with a conductive material such as tungsten, aluminum, or copper permitting the signals to be communicated from the source 5 or drain 6 of the FET to other microelectronic devices using signal conductors such as metals previously mentioned. FETs are produced using a self-aligned process to block implants into source and drain regions of a silicon area.

One step in the process of making FETs involves aligning the polysilicon with the silicon area to ensure that the FETs operate according to preset specifications. The alignment process is never perfect; however, the overlay alignment measurement is critical for FET operation and must be tightly and measurably controlled during manufacture. Currently, there is no accurate measurement of this important parameter that can be done effectively and at low cost. U.S. Pat. No. 5,699,282 uses a technique of alignment measurement that performs electrical measurements. The technique employed requires vias and metal interconnections. Vias and metal interconnections consume valuable design space, which could be used more efficiently for chip test function. Metal interconnection uses up valuable space that is needed to interconnect logical blocks on the semiconductor chip. Therefore, a need exists to create an accurate process that properly measures alignment errors that occur during the manufacture of the semiconductor chip.

Modern semiconductor processes include a silicide step, in which a suitable metal, such as titanium, is deposited on the chip and the chip is heated forming silicide on the sources, drains, and polysilicon which provides those areas with a lower electrical resistance. An example of this prior art design is illustrated in FIG. 1 where source 5 has a source silicide portion 10, drain 6 has a drain silicide portion 13, and polysilicon shape 8 has a polysilicon shape silicide portion 12.

Another particular step in the process of creating FETs involves the creation of a spacer 9A, 9B, which ensures separation of silicide portions of the polysilicon shape 8 from the silicon areas (source 5 and drain 6) to prevent electrical silicide bridging (shorts) between the polysilicon shape 8 and the source 5 and drain 6. The spacer 9A, 9B is generally a silicon oxide composition or other dielectric material. In U.S. Pat. No. 4,983,544, a method is proposed to facilitate the formation of an electrical bridge using silicide as a bridge contact rather than a via or other metal interconnect. It is advantageous to have different interconnection alternatives that give circuit designers additional flexibility when designing circuit layouts. However, U.S. Pat. No. 4,983,544 achieves this flexibility only by providing a mask and subsequent etching steps for selectively etching portions of spacers, thereby exposing corresponding vertical surfaces of polysilicon shapes to a subsequent silicide process, forming an electrically conducting silicide bridge between the polysilicon shape and the silicon area.

Controlling precision in the etching process is a difficult task, and also requires that an additional etching step be inserted into the transistor fabrication process requiring more time and additional etching materials expenses.

Also, it is presently not desirable and considered a groundrule design violation to form a polysilicon shape containing a small angle such that when a spacer is formed on a polysilicon shape, a portion of a vertical surface of the polysilicon shape becomes silicided and can become shorted to the silicon area. If such a design were permitted to exist in the current state of the art, FET designs would not function as designed due to shorts that would occur between the exposed polysilicon and the silicon area.

It would be advantageous to have an alternative method to the traditional via coupling that facilitates the interconnection of microelectronic devices while simultaneously reducing circuit layout constraints and fabrication requirements. Therefore, a need exists to create an alternative method to interconnect microelectronic devices that does not require a via coupling between the metal layer and silicon areas. Furthermore, it is desirable to compact more microelectronic devices into a smaller area. A need also exists to decrease the amount of space required to accommodate a specified number of microelectronic devices and the accompanying metal interconnects. Simplified contact structures, which require less space will result in higher chip densities, lower production costs, increased performance, and reduced power consumption.

SUMMARY OF THE INVENTION

The present invention provides a method of forming an electrical coupling between a polysilicon shape and a silicon area on a semiconductor chip. One embodiment of this method is forming a polysilicon shape having a bridging vertex over a silicon area, creating a spacer on a vertical side of the polysilicon shape except on the bridging vertex, and applying a silicide to the polysilicon shape and to the silicon area thereby creating an electrical coupling between the polysilicon shape and the silicon area at the bridging vertex. Advantageously, no separate mask and special etching step to remove portions of the process are required.

Another aspect of the present invention is a semiconductor device that comprises a polysilicon shape having a bridging vertex formed over a silicon area, a spacer on a vertical side of the polysilicon shape except on the bridging vertex, and a silicide formed on the polysilicon shape and on the silicon area thereby creating an electrical coupling between the polysilicon shape and the silicon area at the bridging vertex.

Yet another aspect of the present invention is a circuit comprising one or more semiconductor devices that each comprises a polysilicon shape having a bridging vertex, the bridging vertex formed over a silicon area, a spacer on a vertical side of the polysilicon shape except on the bridging vertex, and a silicide formed on the polysilicon shape and on the silicon area thereby creating an electrical coupling between the polysilicon shape and the silicon area at the bridging vertex.

Another aspect of the present invention is a method of measuring alignment and bias of a polysilicon shape to a silicon area. One embodiment of this method comprises forming a polysilicon shape to have a bridging vertex, the bridging vertex formed near a silicon area and determining if an electrical bridge exists between the polysilicon shape at the bridging vertex and the silicon area.

Another aspect of the present invention is an apparatus for measuring alignment and bias between a polysilicon shape and a silicon area. One embodiment of this apparatus comprises a silicon area, a plurality of bridging vertices positioned near the active area, wherein each bridging vertex of the plurality of bridging vertices is uniquely positioned relative to the silicon area, and wherein each bridging vertex of the plurality of bridging vertices is coupled to an electrical source.

The present invention offers numerous advantages over conventional semiconductor schemes. For example, embodiments of the present invention require less design space and provide design engineers with alternative methods of interconnection for microelectronic devices. Embodiments of the present invention can also be used to more efficiently measure alignment and bias present in a microelectronic device. These and other features, aspects, and advantages will become better understood with reference to the following description, appended claims, and accompanying drawings.

BRIEF DESCRIPTION OF THE DRAWINGS

FIG. 3A-3F are top views of a polysilicon shape and spacers formed on both sides of the polysilicon shape. FIG. 3C-3F further illustrate spacer behavior around bridging vertices and critical angles.

FIG. 11 is a table illustrating example bias and misalignment measurement results.

FIGS. 12A, 12B, 12C is a top view illustration of a measuring apparatus comprises of polysilicon shape pairs and a silicon area.

FIG. 14 is a flow chart describing a method for forming a field effect transistor (FET) containing a bridging vertex and resulting electrical coupling.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches methods and apparatus to create a semiconductor device having a bridging vertex formed on a polysilicon shape to create an electrically conducting bridge between the polysilicon shape and a silicon area at the bridging vertex.

Figure 1:
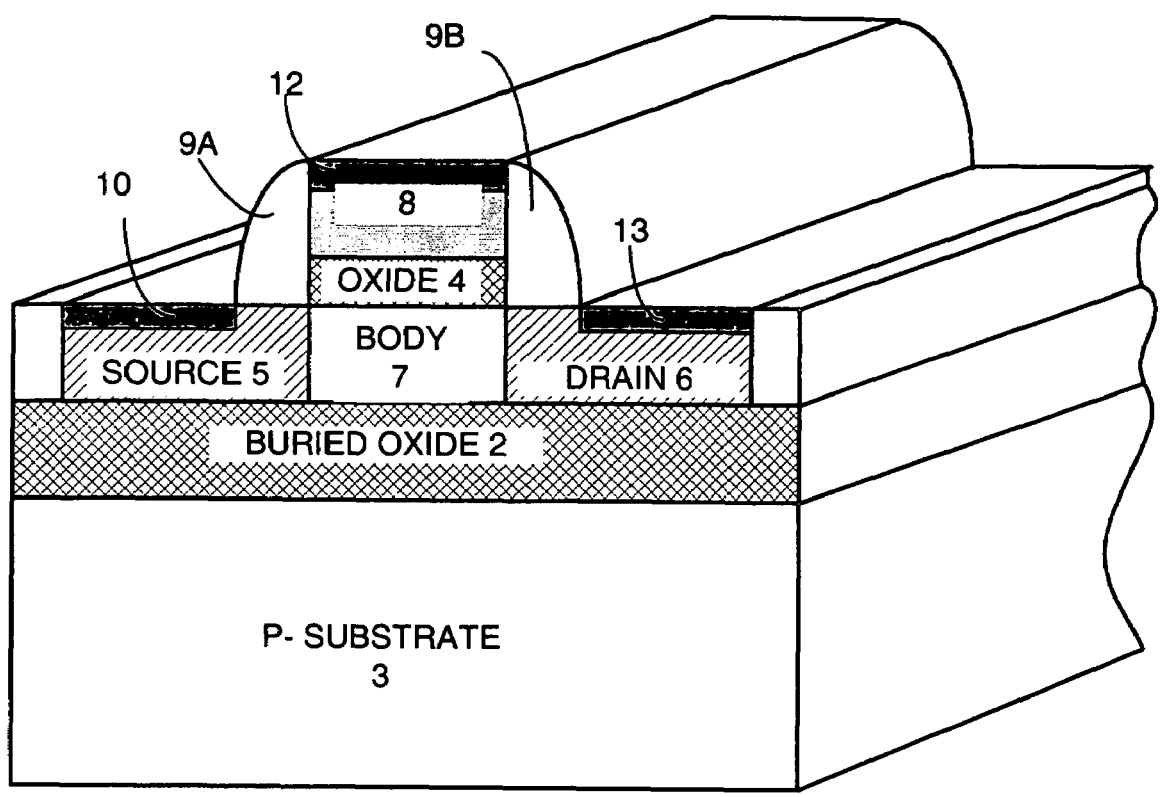
FIG. 1 is a prior art drawing illustrating a simplified isometric view of a conventional silicon on insulator (SOI) field effect transistor (FET).

FIG. 1 is a prior art drawing illustrating a simplified isometric view of a conventional silicon on insulator (SOI) field effect transistor (FET). Although a SOI process is used for illustration, the invention is not limited to SOI processes. In an SOI FET production process, a buried oxide (BOX) 2 is first formed in a silicon substrate 3. Generally, silicon substrate 3 is lightly doped, and a P– substrate is commonly used. After buried oxide 2 has formed, another layer of silicon substrate 3 or suitably doped silicon such as silicon germanium is formed on the buried oxide 2. Alternatively, if buried oxide 2 is formed by oxygen implant, a portion of silicon substrate 3 remains above buried oxide 2, and can be used to make FET devices. Following the creation of buried oxide 2, recessed oxide (ROX) areas are formed (not shown) as areas where no semiconductor devices will be formed. A thin oxide layer 4 is then created followed by the formation of a polysilicon shape 8. Thin oxide layer 4 is then etched away except for areas on which polysilicon shape 8 has been formed. Portions of silicon substrate 3 are then generally implanted with ions to create a source 5 and a drain 6. In a conventional PFET, body 7 will be doped N–. Conversely, in a conventional NFET, body 7 will be doped P–. Areas not in ROX areas are silicon areas, including in FIG. 1, source 5, drain 6, and body 7. Spacers 9A, 9B are then created on the vertical sides of polysilicon shape 8. Following this step, a silicide step creates silicide on exposed surfaces of source 5, drain 6, and polysilicon shape 8 by coating the chip with titanium or other suitable material and heating the structure to create source silicide 10, drain silicide 13, and polysilicon shape silicide 12. The silicide will be created only on exposed silicon or polysilicon surface areas that have not been covered by an insulating composition such as a spacer (i.e. oxide). The application of silicide to select areas of the semiconductor increases conductivity.

Figure 2:
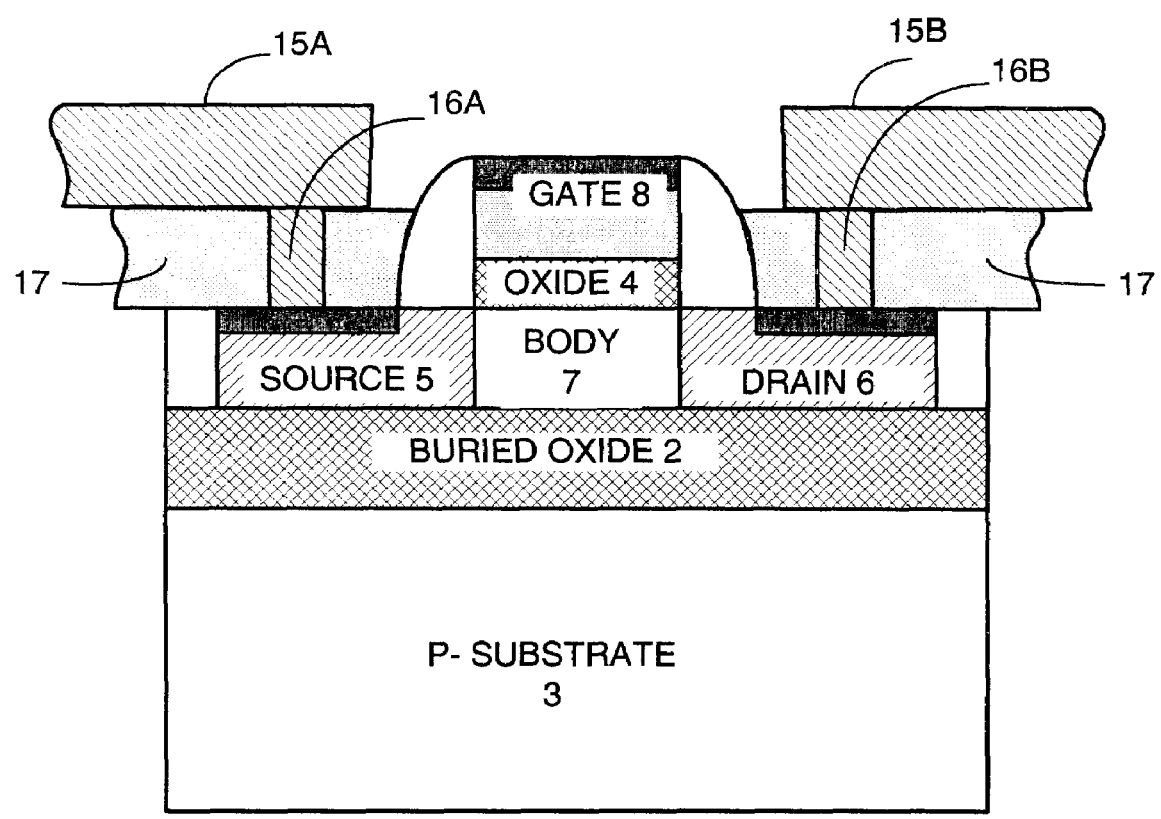
FIG. 2 is a prior art cross-sectional drawing further illustrating the design of a conventional silicon on insulator field effect transistor.

FIG. 2 is a prior art drawing further illustrating the design of a conventional silicon on insulator (SOI) field effect transistor (FET). In FIG. 2, an insulating layer of dielectric 17 is shown. Dielectric 17 creates an insulating barrier between metal layer 15A, 15B and source 5 and drain 6. Metal layer 15A and 15B are used to transfer electrical signals between two or more semiconductor devices and use vias 16A, 16B as means to transfer electrical signals from source 5 and drain 6 to metal layer 15A, 15B. Vias 16A, 16B are physical holes created in dielectric 17 using methods such as drilling, etching, or chemical bathing and require the use of a mask. The physical holes are filled with electrically conductive materials such as titanium, aluminum, copper, or tungsten permitting the transfer of electrical signals.

Figure 3A:
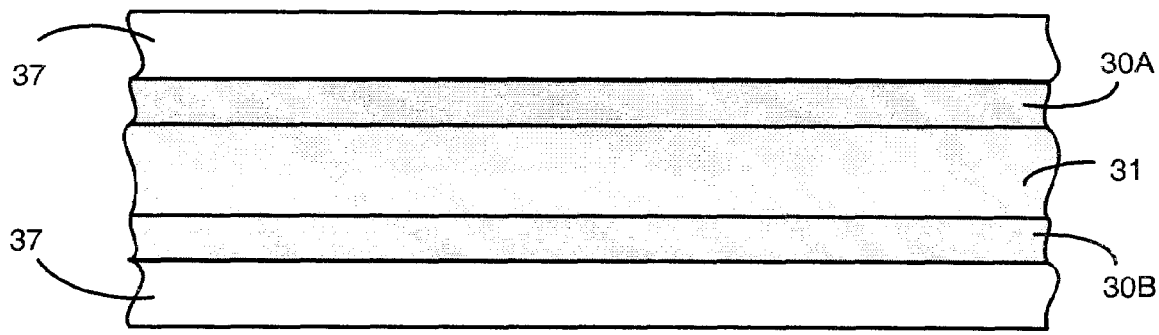
Figure 3B:
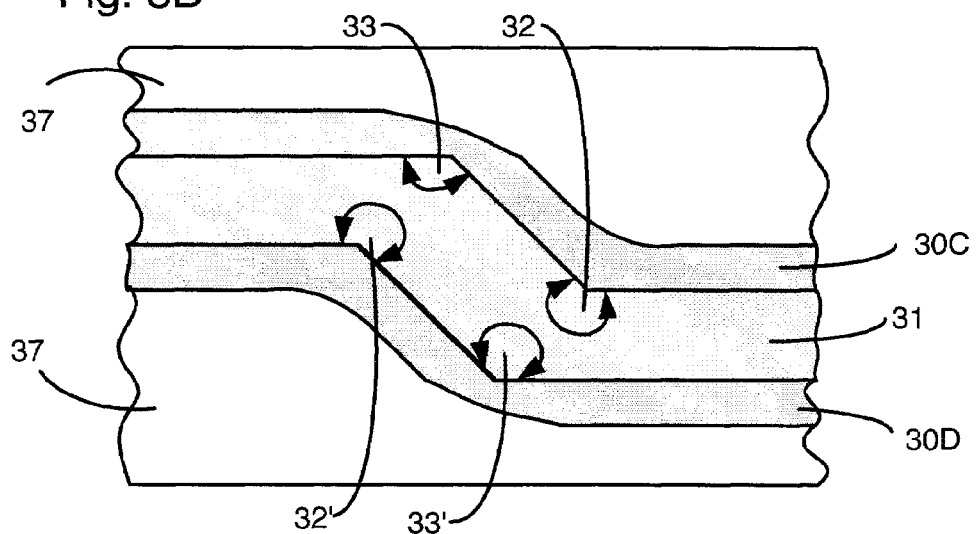

FIG. 3A is a top view of a polysilicon shape 31 and spacers 30A, 30B formed on both sides of polysilicon shape 31. The spacers 30A, 30B prevent silicide from forming on vertical surfaces of polysilicon shape 31, which could result in electrical bridging between silicide formed on polysilicon shape 31 and silicide formed on a silicon area 37. Spacers will be referred to generically as spacer 30, with a letter appended to identify a particular spacer in a figure. FIG. 3A illustrates a consistent spacer width along the length of polysilicon shape 31 that remains straight in its entirety. FIG. 3B illustrates a thinning of spacer 30A and 30B on angles less than 180 degrees, and a thickening behavior of spacer 30A and 30B when applied to polysilicon shape 31 containing an angle greater than 180 degrees. In the case of FIG. 3B, the width of spacer 30A has increased where a first polysilicon angle 32, 32' is greater than 180 degrees when the angle measurement is taken on the inner region of polysilicon shape 31 as shown by the curved line having two arrowheads. A second polysilicon shape angle 33,33' illustrates spacer thinning that accompanies a polysilicon shape angle 33, 33' of less than 180 degrees when the measurement is taken on the inner surface of the polysilicon shape 31.

Figure 3C:
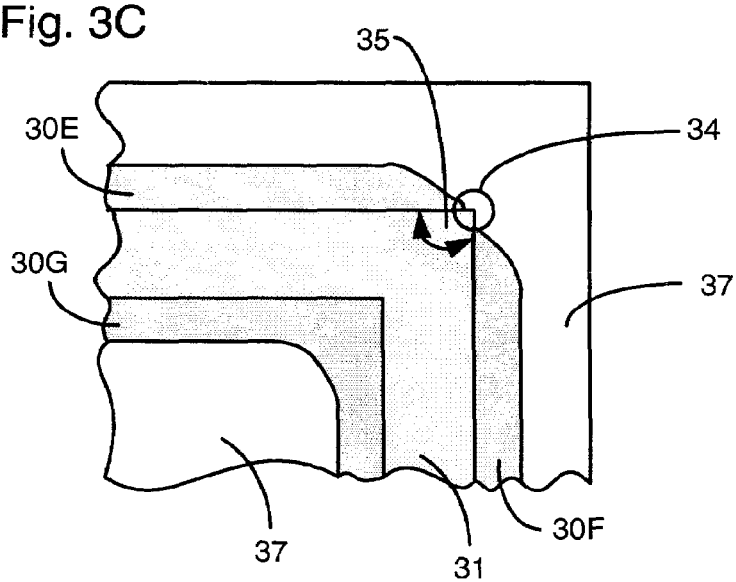

FIG. 3C illustrates a bridging vertex 34 (circled), which is created when polysilicon shape 31 is formed having angle equal to or less than a critical angle 35. Bridging vertex 34 is a portion of a polysilicon shape 31 positioned near silicon area 37 such that an electrical bridge exists between silicon area 37 and polysilicon shape 31. The meaning of "near" when used to define a bridging vertex is further defined as a proximate distance between a bridging vertex and a silicon area which creates an electrical coupling between the bridging vertex and the silicon area. If a polysilicon shape is formed with a bridging vertex positioned over a silicon area, an electrical connection (a low resistance connection or short) will be formed between the bridging vertex and the silicon area. If a polysilicon shape is formed with a bridging vertex formed over a ROX area, a low resistance connection is not made to any silicon area.

In embodiment 3C, a vertical surface of polysilicon shape 31 is not covered by spacer 30E or 30F and is therefore exposed to the silicide process. Silicide forms on the vertical surface of polysilicon shape 31 at the bridging vertex 34, and creates an electrical bridge to silicon area 37. The design of this embodiment is advantageous because bridging vertex 34 eliminates the need to create a via, requires less space than a via, and reduces the amount of metal required for an interconnection in a design; thus, couplings to transmit electrical signals can be implemented between polysilicon shape 31 and silicon area 37 without a via, without a special mask to selectively etch portions of spacers, and without a separate step to remove a portion of a spacer. A critical aspect of this design is the formation of polysilicon shape 31 having a bridging vertex defined by an angle less than or equal to critical angle 35. Critical angle 35 is the angle at which the spacer width becomes sufficiently small to create an electrical bridge between polysilicon shape 31 and silicon area 37. Silicide formed on the exposed vertical wall of polysilicon shape 31 results in the formation of a silicide bridge over a thin oxide (similar to thin oxide 4 in FIG. 1), shorting polysilicon shape 31 to silicon area 37. Critical angle 35 required to create a bridging vertex depends on the materials used to create spacer width of spacer 30, thickness of the thin oxide, production processes used to create the FET, and the precision of the process used to manufacture the FET.

FIG. 3D, 3E, 3F are additional exemplary embodiments containing polysilicon shape 31 that result in bridging vertex 34. Bridging vertices in FIGS. 3E and 3F use slightly curved surfaces in place of pointed designs as illustrated in FIGS.

Figure 3H:
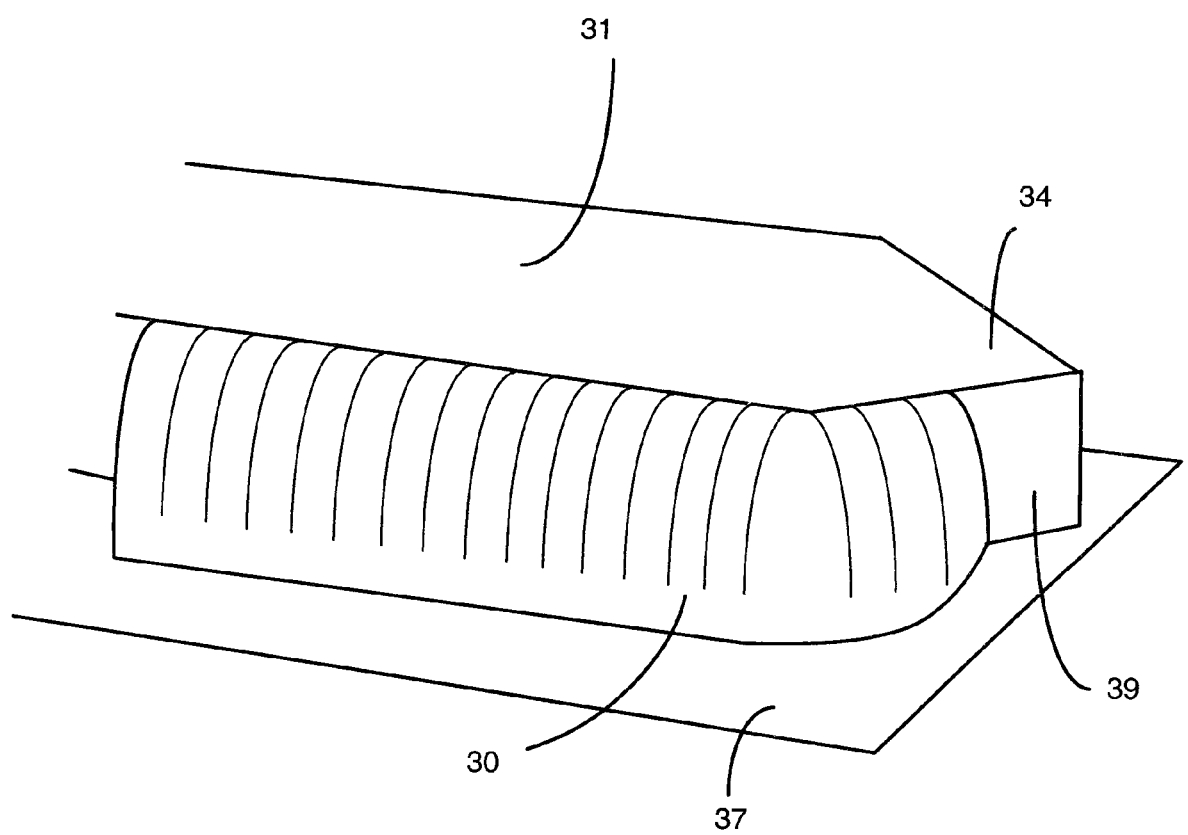
FIG. 3H is an isometric drawing of a spacer, bridging vertex, and polysilicon shape demonstrating thinning of the spacer near the bridging vertex.

3C and 3D. Therefore, as illustrated in FIG. 3C, 3D, 3E, 3F the construction of bridging vertex 34 requires only a polysilicon shape that causes an electrically conducting silicide bridge be formed. FIG. 3C-3F illustrates variations of bridging vertex 34; however, innumerable variations exists and all such variations achieving a bridging vertex 34 are contemplated and within the scope of this invention. FIG. 3H is an isometric illustration of polysilicon shape 31 containing bridging vertex 34. In this illustration, spacer 30 thins and thus exposes polysilicon shape 31 to the silicide process on a vertical side 39; the silicide formed on vertical side 39 forming a silicide bridge to silicon area 37, which creates an electrical bridge. Note that in FIG. 3H, for simplicity, spacer 30 is illustrated on only one side of polysilicon shape 31; however, in an actual embodiment both vertical sides of polysilicon shape 31 will have spacers 30.

Figure 4:
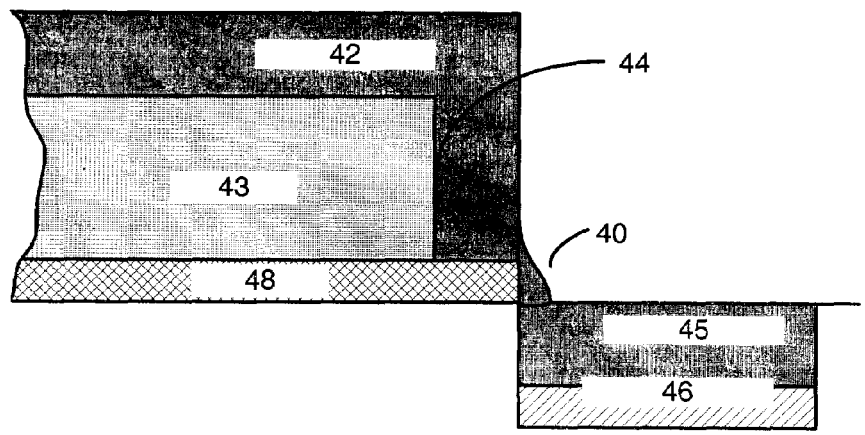
FIG. 4 is a simplified, cross-sectional view of a semiconductor and illustrates a silicide bridge.

FIG. 4 illustrates a silicide bridge 40 that exists between a silicon area 46 and a polysilicon shape 43. Before silicide is applied to polysilicon shape 43 or silicon area 46, no electrical bridging occurs between the two regions because a thin oxide layer 48 insulates the two regions. To illustrate an electrical bridge created from silicide, a silicide bridge 40 is illustrated that electrically couples polysilicon shape 43 and silicon area 46. When the width a spacer 30 becomes sufficiently small, a portion of one or more vertical sides of polysilicon shape 43 are left exposed to a subsequent silicide processing step. In the subsequent silicide processing step, silicide is created on areas of polysilicon shape 43 that were left exposed, and silicide bridge 40 is formed between polysilicon shape silicide 42 and silicon area silicide 45. Note in particular that in absence of a spacer, silicide forms on vertical surface 44 of polysilicon shape 43. Also, polysilicon shape silicide 42 is electrically coupled to polysilicon shape 43 and also that silicon area silicide 45 is electrically coupled to silicon area 46. It is relevant to note here that the thickness of thin oxide 48 is extremely thin and is on the order of 10 angstroms today. Three silicide regions are created during the silicide process: polysilicon shape silicide 42, silicide bridge 40, and silicon area silicide 45. Note the lines that exist in FIG. 4 to distinguish the silicide regions are exemplary only and do not exist in an actual embodiment; therefore, the silicide regions should be viewed as one continuous region.

Figure 5:
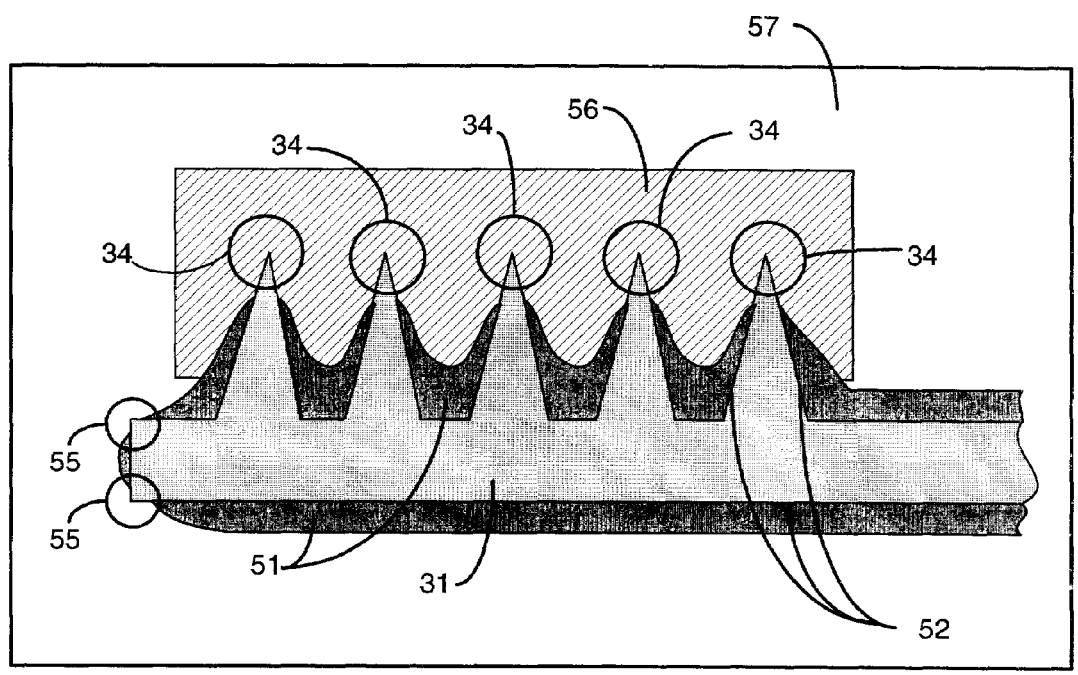
FIG. 5 is a top view diagram illustrating multiple bridging vertices coupling a polysilicon shape to a silicon area.

FIG. 5 is an exemplary top view of an embodiment containing multiple bridging vertices 34. Bridging vertices 34, as described above, provides an electrical short between polysilicon shape 31 and a silicon area 56. Surrounding polysilicon shape 31 is a spacer 51 that prevents electrical bridging from occurring between polysilicon shape 31 and silicon area 56 except at the bridging vertices 34. The area of polysilicon shape 31 that is covered by spacer 51 will be defined as an insulated region 52. Furthermore, insulated region 52 is defined as any part of polysilicon shape 31 that is not coupled to silicon area 56 by way of a silicide bridge 40 (FIG. 4). Another bridging vertex 55 is illustrated as an area of polysilicon shape 31 where a vertical surface of polysilicon shape 31 was exposed to silicide, but is not electrically coupled to silicon area 56. In FIG. 5, bridging vertex 55 is positioned over a ROX region 57 where no electrical coupling can occur, and thus while bridging vertex 55 is silicided on vertical surfaces, it does not electrically short to any other conductor.

Figure 6:
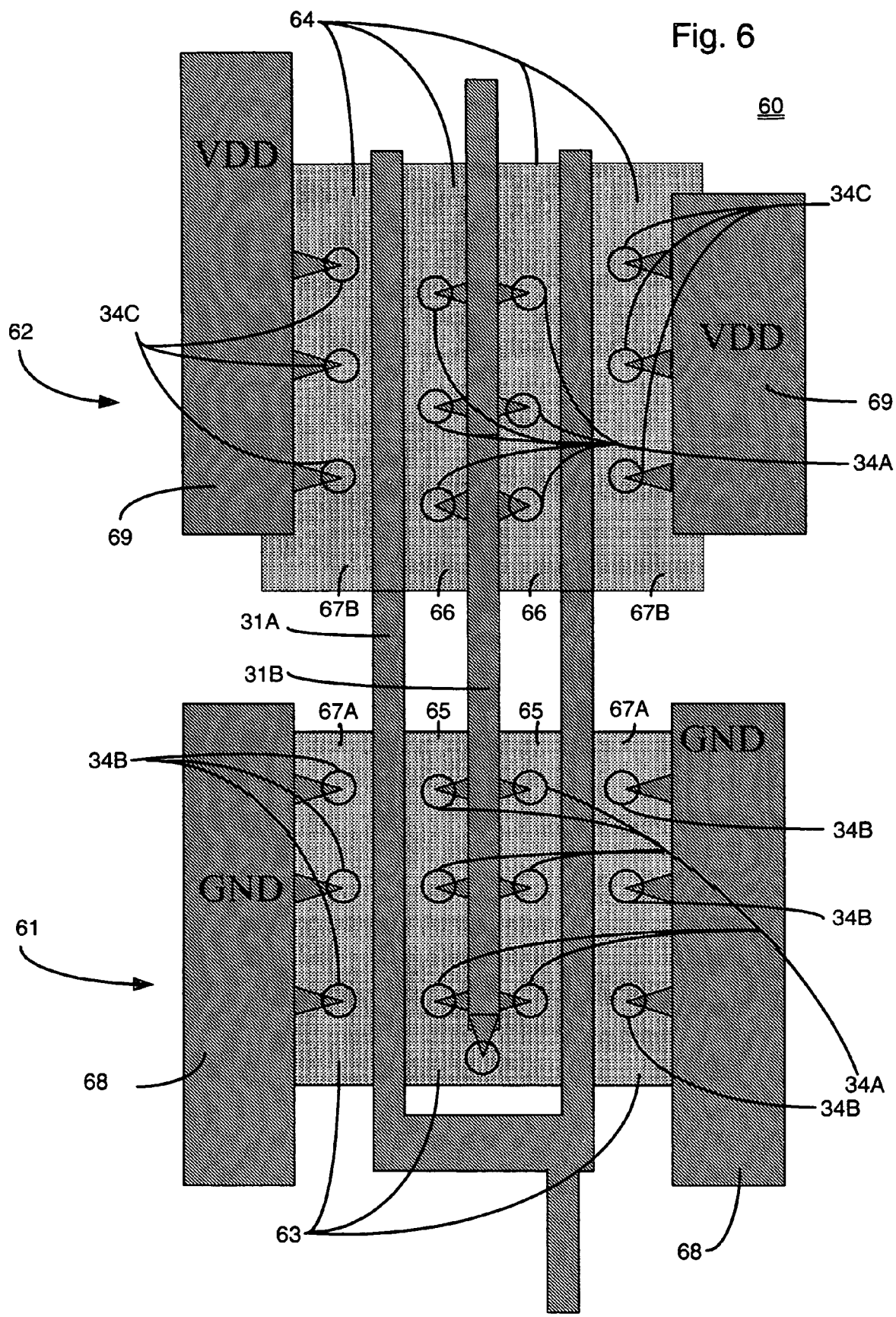
FIG. 6 is a top-view illustration of a circuit implementing multiple FETs containing bridging vertices.

FIG. 6 is an exemplary embodiment of an inverter circuit 60 comprising NFET 61 and PFET 62 employing multiple bridging vertices 34 (all circled). Note that bridging vertex 34 pertains to a generic bridging vertex, while particular instances of a bridging vertex are denoted by appending a letter, e.g. 34A, 34B. For simplicity, spacers are not drawn, but as taught earlier exist on the vertical walls of the polysilicon shapes and are not present at the bridging vertices. A polysilicon shape 31A is the gate of NFET 61 and PFET 62. A polysilicon shape 31B is shown containing bridging vertices 34A. In this embodiment, the polysilicon shape 31B is routed over NFET silicon area 63 and PFET silicon area 64 coupling an NFET drain 65 to a PFET drain 66. Bridging vertices 34B are formed to connect an NFET source 67A to a ground polysilicon shape 68. Bridging vertices 34C are used to connect PFET source 67B to VDD polysilicon shape 69.

Figure 7:
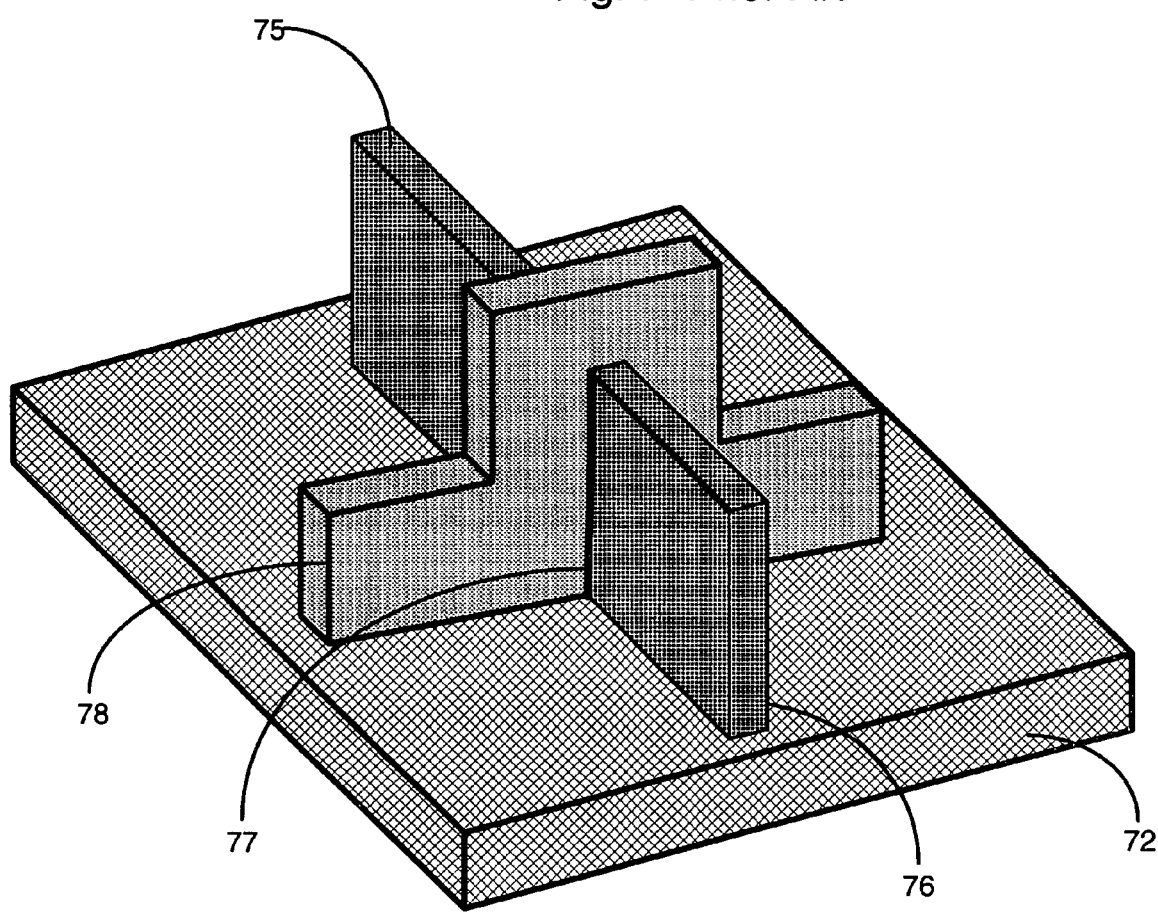
FIG. 7 is an isometric prior art drawing of a FinFET.

FIG. 7 illustrates a prior art FinFET semiconductor device. Three-dimensional FETs (FinFET) have been designed to facilitate increased device density. FinFETs use a polysilicon conductor routed over vertical sides and top of a fin (i.e. FinFET body), to facilitate scaling of CMOS dimensions, while maintaining an acceptable performance. In particular, the use of the FinFET structure suppresses Short Channel Effects (SCE), provides for lower leakage, and provides for more ideal switching behavior. In addition, the use of the FinFET structure increases polysilicon shape area, which allows the FinFET to have better current control, without increasing the polysilicon shape length of the device. As such, the FinFET is able to have the current control of a larger two-dimensional FET without requiring the device space of the two dimensional FET. FIG. 7 illustrates a source 75 and drain 76 which are formed on an oxide 72. A polysilicon shape 78 is forms the gate for the FinFET. A thin oxide 77 separates the silicon fin comprising source 75 and drain 76.

Figure 8:
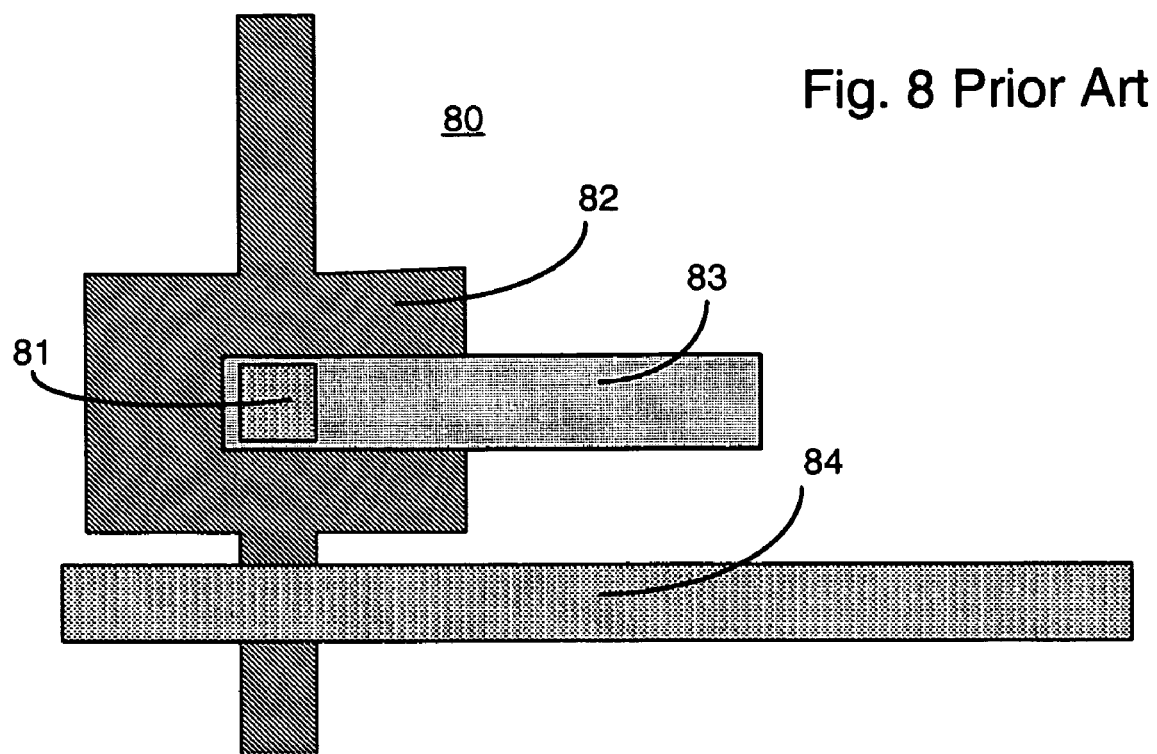
FIG. 8 is a prior art top-view illustration of a via interconnect not utilizing bridging vertices.

FIG. 8 is a top view illustration of a prior art FinFET design comprised of polysilicon shape 84, having polysilicon shape 84 covering both vertical sides and top of FinFET 80. A via 81 is used to form an electrical coupling between a source 82 and a metal layer 83.

Figure 9:
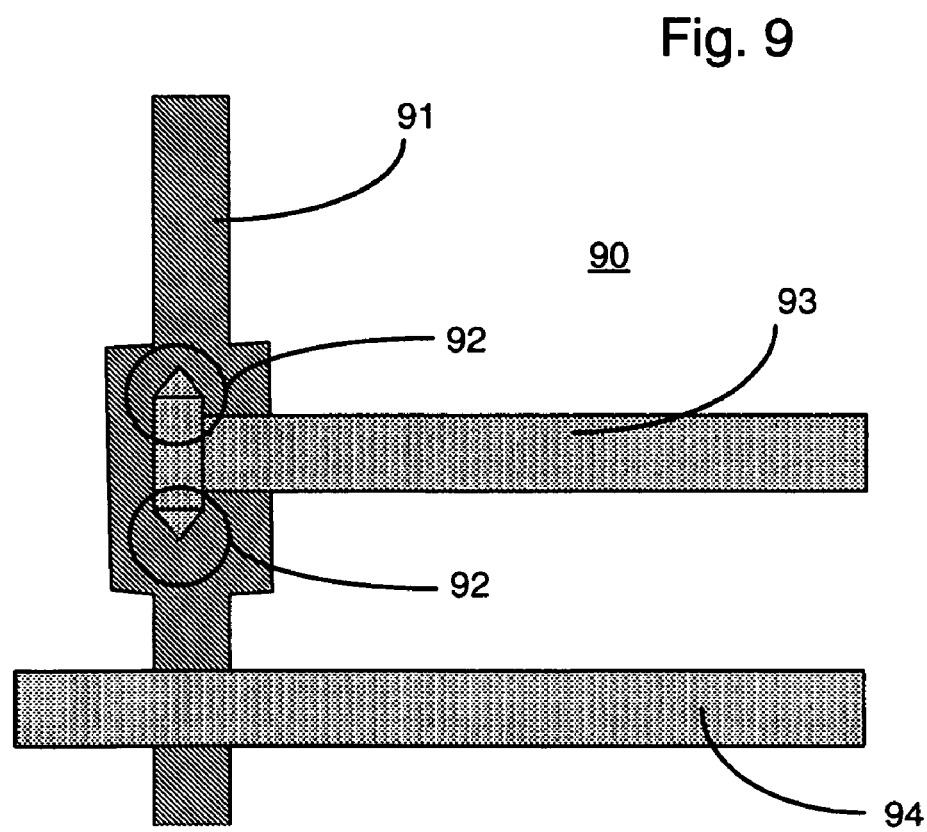
FIG. 9 is a top-view illustration of a functionally equivalent embodiment to the illustration shown in FIG. 8, but utilizing bridging vertices in place of a via.

FIG. 9 is functionally similar to FIG. 8. Bridging vertices 92 couple source 91 to polysilicon conductor 93. Polysilicon shape 94 is the gate electrode of FinFET 90. FIGS. 8 and 9 are not drawn to scale, however, savings in metal wiring space, are saved when electrical couplings between FinFETs and other microelectronic devices are implemented using bridging vertices.

The use of bridging vertices can be extended beyond the application of FETs. As described in the background, electrical measurements must be taken between the polysilicon shape and the silicon area during manufacture. If the amount of measured error exceeds a predetermined amount specified by a process designer, steps must be taken to correct the problem or discard the faulty product. Two common measures of manufacturing precision are bias and alignment. Bias refers to the variation in the size of the silicon area or polysilicon shape relative to a predetermined specification. Alignment refers to the orientation of the polysilicon shape relative to the silicon area. In the following description, bias and alignment measurements are first explained separately to clearly illustrate each of the two measures and then the measures are described in conjunction with one another.

Figure 10A:
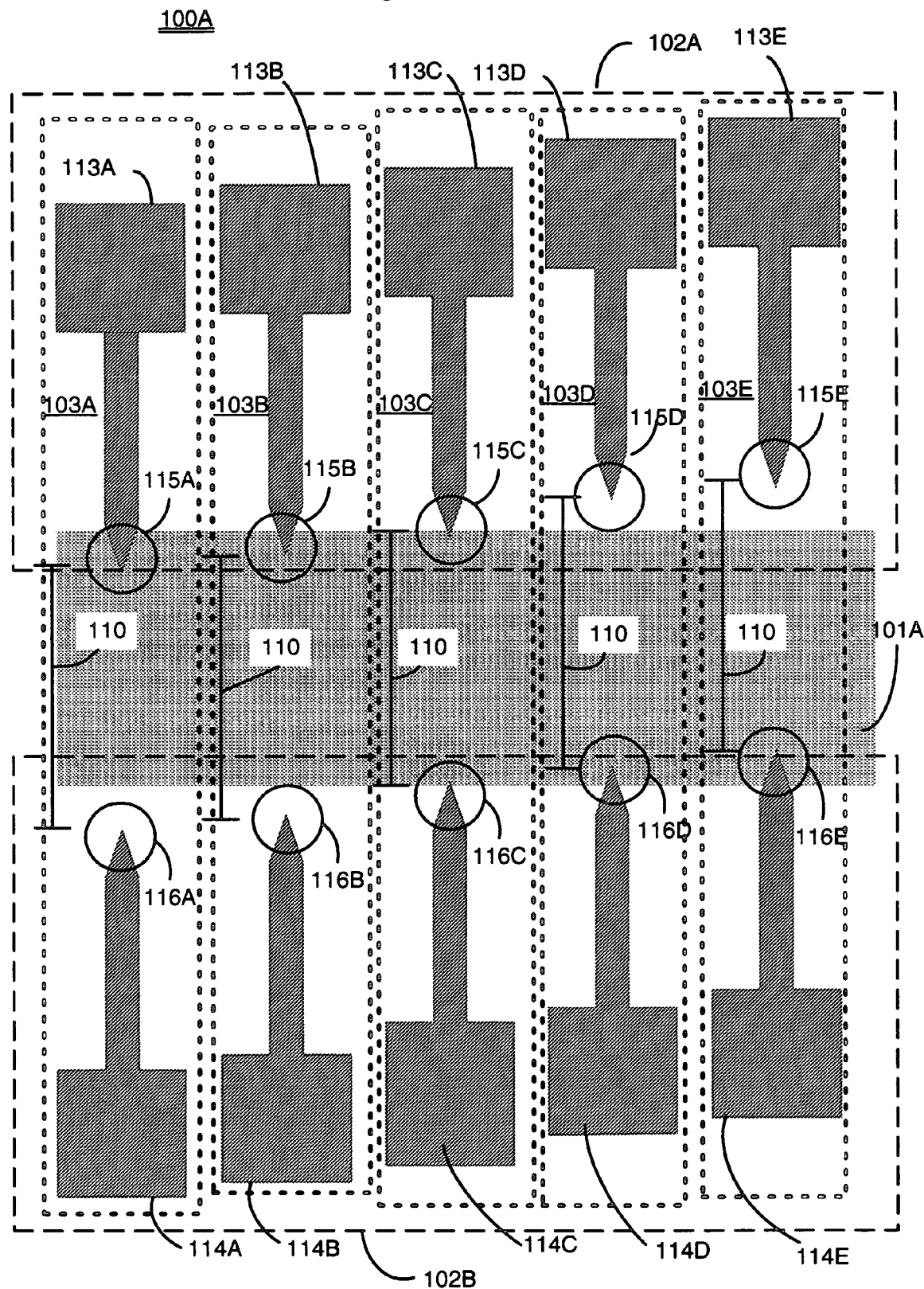
FIG. 10A is a top-view illustration of a measuring apparatus having a plurality of polysilicon shape pairs and a silicon area.

A measurement apparatus 100A is shown in FIG. 10A, which performs the measuring function. A silicon area 101A is formed with a plurality of polysilicon shapes 102A, 102B (enclosed in dashed lines) formed on two or more sides of silicon area 101A. A first polysilicon shape 113A is formed near silicon area 101A, and a second polysilicon shape 114A is formed directly facing first polysilicon shape 113A creating a polysilicon shape pair 103A (enclosed by dotted line). First polysilicon shape 113A has bridging vertex 115A and second polysilicon area 114A has a bridging vertex 116A. A distance 110 exists between bridging vertex 115A and bridging vertex 116A. Distance 110 may remain constant or vary depending on the design of the apparatus for other instances of a polysilicon shape pair. Each polysilicon shape pair 103 is uniquely oriented relative to silicon area 101A and all polysilicon shapes are processed by the same mask, therefore, have the same alignment relative to silicon areas. As previously described, if for example bridging vertex 115A is overlapping silicon area 101A, an electrical bridge will occur at bridging vertex 115A. Therefore, an electrical test can be applied to measure the orientation of each polysilicon shape pair 103 by determining if an electrical bridge exists. An electrical bridge can be determined by measuring some electrical quantity. The electrical quantity could be resistance, voltage, current, or any other electrical quantity. The electrical measurements could be obtained through any number of means including but not limited to pad cages, probing, or a pass gate multiplexor.

By equally spacing each polysilicon shape pair according to distance 110 with unique orientations relative to silicon area 101A, the presence or absence of electrical bridges can be used to determine alignment of polysilicon shapes to silicon area 101A. In an exemplary embodiment as shown in FIG. 10A, a properly aligned polysilicon shape pair 103C is characterized by the occurrence of an electrical bridge on a bridging vertex 115C and an electrical bridge on a bridging vertex 116C. If an electrical bridge is observed on only one polysilicon shape of a polysilicon shape pair 103C, then the polysilicon shape pair 103C is not properly aligned with silicon area 101A. When a plurality of polysilicon shape pairs exist, each polysilicon shape pair can be systematically tested to determine if an electrical bridge exists. According to FIG. 10A for example, a simple resistance measurement could be made at each of the polysilicon shapes and a threshold resistance of 10K ohms could be chosen. In this case, less than 10K ohms resistance would signify a bridge occurs and greater than or equal to 10K ohms would signify an electrical bridge does not occur. Ten electrical tests would be run; one test for each polysilicon shape. To quantify results, a 1 would represent an electrical bridge and a 0 would imply no electrical bridge exists. The test results of first plurality of polysilicon shapes 102A would be represented by 11100 when the test begins with the leftmost polysilicon shape and ends with the rightmost polysilicon shape. A similar test could be applied to second plurality of polysilicon shapes 102B and test results would produce 00111. Analysis of the results would reveal that polysilicon pair 103C is properly aligned as indicated by electrical bridges occurring on both bridging vertices of the polysilicon pair. While this example determines proper alignment through the detection of electrical bridges, detecting the absence of electrical bridges may also be used in a similar manner.

In addition to measuring the alignment of a polysilicon shape relative to a silicon area, variation in the size of a silicon area or a polysilicon shape can also be measured utilizing bridging vertices. Those skilled in the art will recognize that variation in the size of a silicon area or polysilicon shape is referred to as bias. In a preferred embodiment, each polysilicon shape pair e.g. 103A, 103B is separated by a constant distance 110.

Figure 10B:
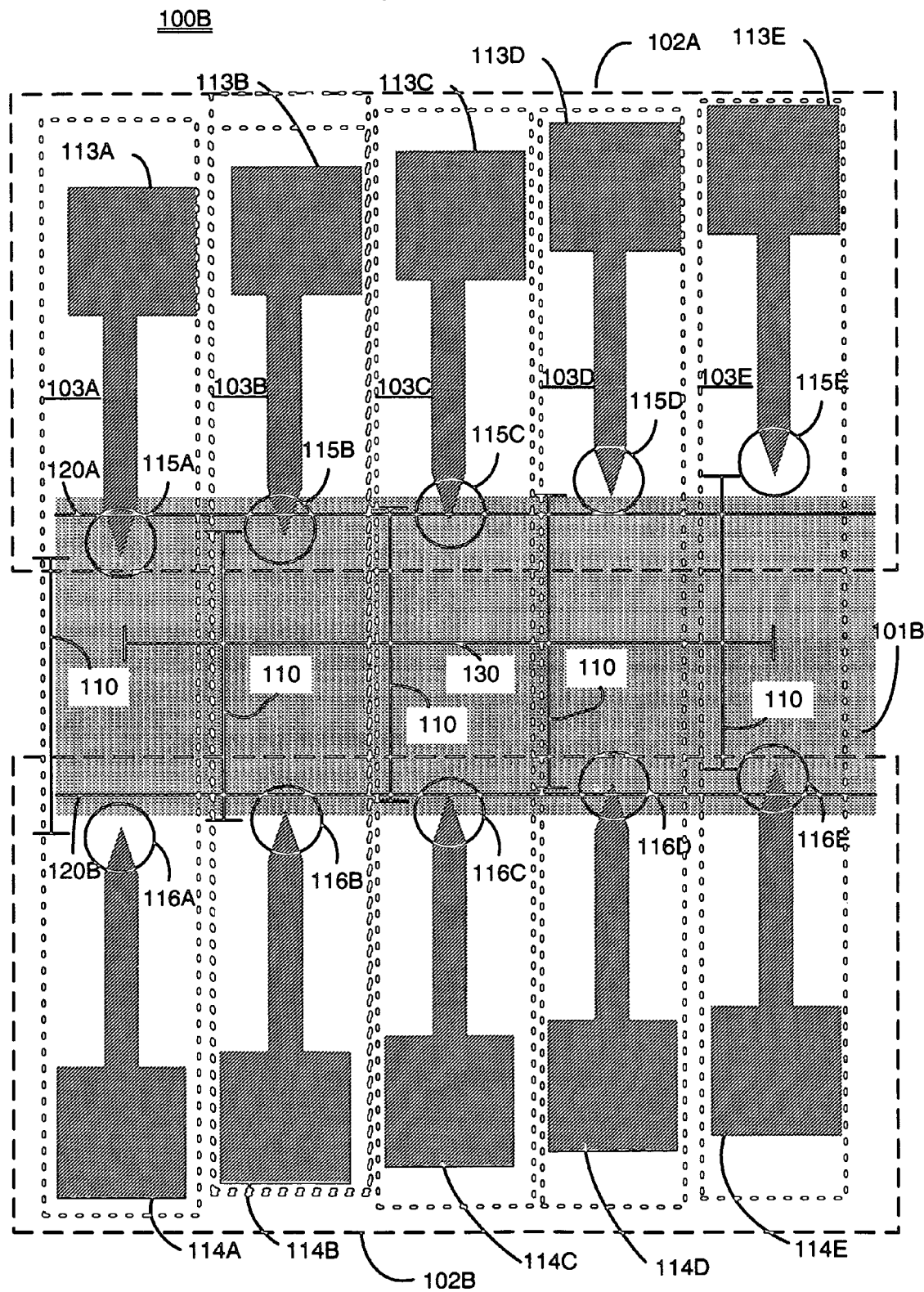
FIG. 10B is a top-view illustration similar to FIG. 10A, but having a silicon area exhibiting bias.

FIG. 10B illustrates silicon area 101B when it is actually larger than an expected size, and bias will thus be detected due to the large number of electrical shorts that will be observed. Solid lines 120A, 120B illustrate the expected edges of the top and bottom sides of the silicon area 101B. In such a case, more polysilicon shapes 113A, 113B, 114A, 114B, etc. will be overlapping silicon area 101B resulting in more shorts. Similarly, if a silicon area is smaller than expected, implying a bias is present, fewer or no electrical bridges may be observed. The absence of electrical bridges in such a case is the result of a distance 110 that is too large for any bridging vertex to overlap silicon area 101B. To measure alignment accurately, the total effect of bias on the measurement must be accounted for. It is possible to compensate for bias, e.g. in FIG. 10B by determining where the transition between opens and electrical shorts occur in two or more pluralities of polysilicon shapes. In FIG. 10B, a first open can be observed on bridging vertex 115E of a first plurality of polysilicon shapes 102A and a second open can be observed on bridging vertex 116A of a second plurality of polysilicon shapes 102B. Determining a horizontal distance 130 between a first open (at bridging vertex 115E) on the top side of silicon area 101B and a second open (at bridging vertex 116A) on the bottom side of silicon area 101B, properly aligned polysilicon shape pair 103C can be located by averaging horizontal distance 130. Generally, a properly aligned polysilicon shape pair is located by determining the horizontal distance existing between the two opens nearest the properly aligned polysilicon shape pair wherein the first open must be located on a first side of a silicon area and the second open must be located on the side opposite the first side of a silicon area. Similarly, to compensate for a silicon area exhibiting bias where the silicon area is smaller than expected, the same procedure may be used, but instead measuring shorts in place of opens to determine the horizontal distance.

Figure 12B:
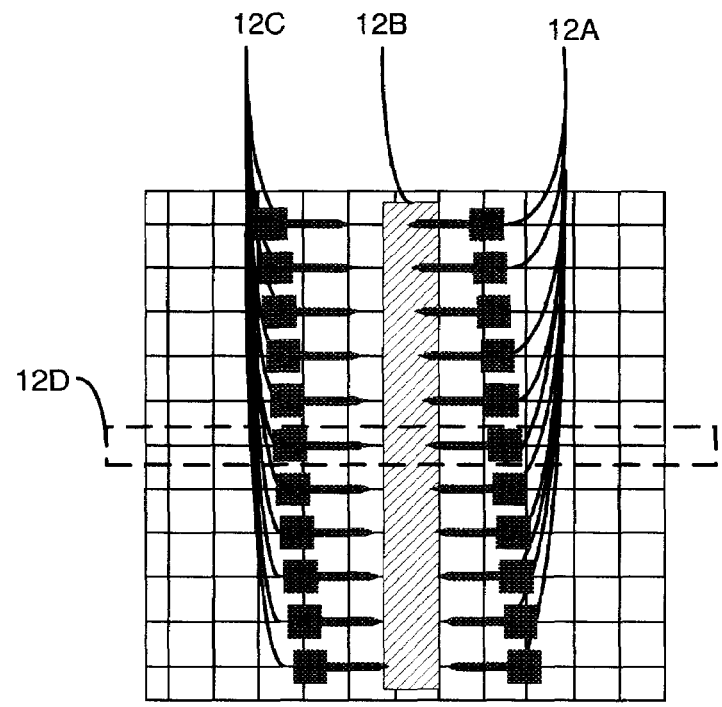
Figure 12C:
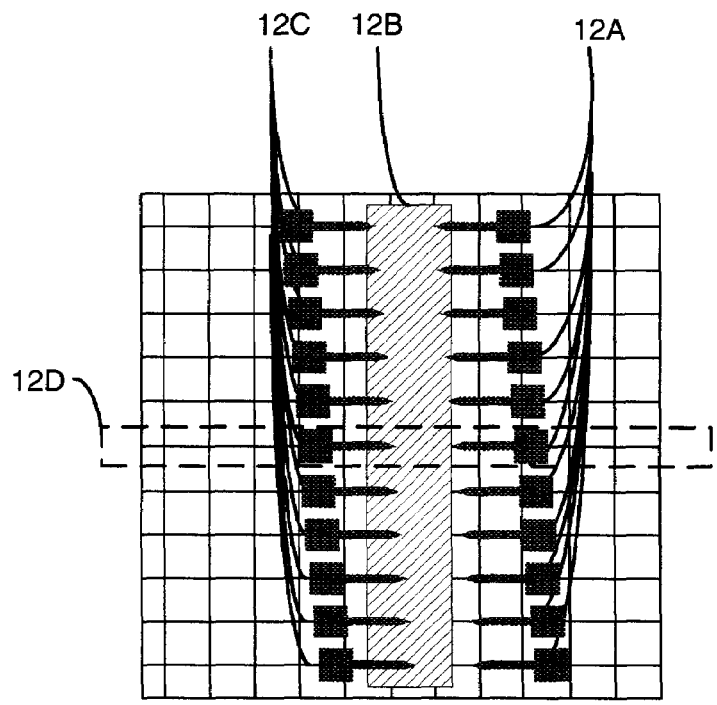

The combined effect of bias and alignment on measurement results can now be explained in greater detail. FIG. 11 is a table containing various combinations of bias and alignment. For this table, assume 1=short (i.e. polysilicon shape is electrically bridged to a silicon area) and 0=open (i.e. polysilicon shape is not electrically bridged to a silicon area). Further assume a grid is superimposed over the polysilicon shape and silicon area and each graduation in the grid has a value of one grid point. It should be noted that the grid superimposed in FIGS. 12A, 12B and 12C is not drawn to scale and is shown only to indicate that a grid is used when determining the positions of polysilicon shapes relative to a silicon area. The positioning of each polysilicon shape ranges from +10 grid points relative to the silicon area to −10 grid points relative to the silicon area. A polysilicon shape positioned 10 grid points to the right would be considered +10 grid points, and similarly a polysilicon shape positioned 10 grid points to the left relative to the silicon area would be considered −10 grid points. Each polysilicon shape in a pair of polysilicon shapes (e.g. a left polysilicon shape and a right polysilicon shape) has a specific orientation based on the grid. When the polysilicon shape pair is aligned appropriately with the silicon area and no bias exists, the polysilicon shape is defined to be properly aligned. Therefore, each silicon shape may assume 21 different positions when a position 0 is included. FIGS. 12A, 12B and 12C illustrates polysilicon shapes at different positions relative to the silicon area. The open/short relationship between the position of the silicon shape and the polysilicon area are illustrated in the number sequences found in FIG. 11.

FIG. 12A will be used to illustrate the relationship between right polysilicon shapes 12A, silicon area 12B, and left polysilicon shapes 12C when measuring bias and alignment using measuring apparatus 12 where no bias or misalignment exists. Case 1 of FIG. 11 is illustrated in FIG.

12A, wherein an aligned polysilicon shape pair 12D is perfectly aligned and silicon area 12B has no bias. Column B of FIG. 11 illustrates each open/short value for left polysilicon shapes 12C. Similarly, Column C of FIG. 11 illustrates each open/short value for right polysilicon shapes 12C. In Case 1 where no bias exists, correct alignment occurs at an offset of zero grid points for both the right polysilicon shape and the left polysilicon shape of aligned polysilicon shape pair 12D. It is possible that a measuring apparatus may measure misalignment when no bias is present as described in Case 2 and illustrated in 12B. No bias can be assumed because 12 shorts are observed implying no more and no less silicon area is present than expected. If bias was present and more silicon area was present, an accompanying increase in shorts (1's) should be observed resulting from more polysilicon shapes in contact with the silicon area. In Case 2, the measuring apparatus indicates misalignment because the short/open test results of the left side (shown in FIG. 11 Column B) reveal fewer shorts and the right side reveals a surplus of shorts. It can be inferred from the surplus of four shorts in Column C and shortage of four shorts in Column B that misalignment of the polysilicon shape pairs is four grid points to the left.

Case 3 of FIG. 11 (illustrated in FIG. 12C) is an embodiment displaying both misalignment and bias. Bias can be inferred by the presence of 16 shorts indicating the silicon area has increased in size by 4 grid points. Examining the numerical open/short representation for polysilicon shapes on the left side, it could be inferred that the polysilicon shape pairs are shifted to right five grid points; however, the numerical open/short sequence in Column C indicates the right side is shifted to the right by one grid point. To resolve the alignment discrepancy of each side, the surplus of shorts is averaged between the two sides and the correct measurement of misalignment is three grid points to the right. Case 4 of FIG. 11 illustrates an unusable product or faulty test. The random occurrences of shorts and opens reveal faulty fabrication, damage to the device, or some other event rendering the device useless. Bias and misalignment cannot be measured based on such results.

Figure 13A:
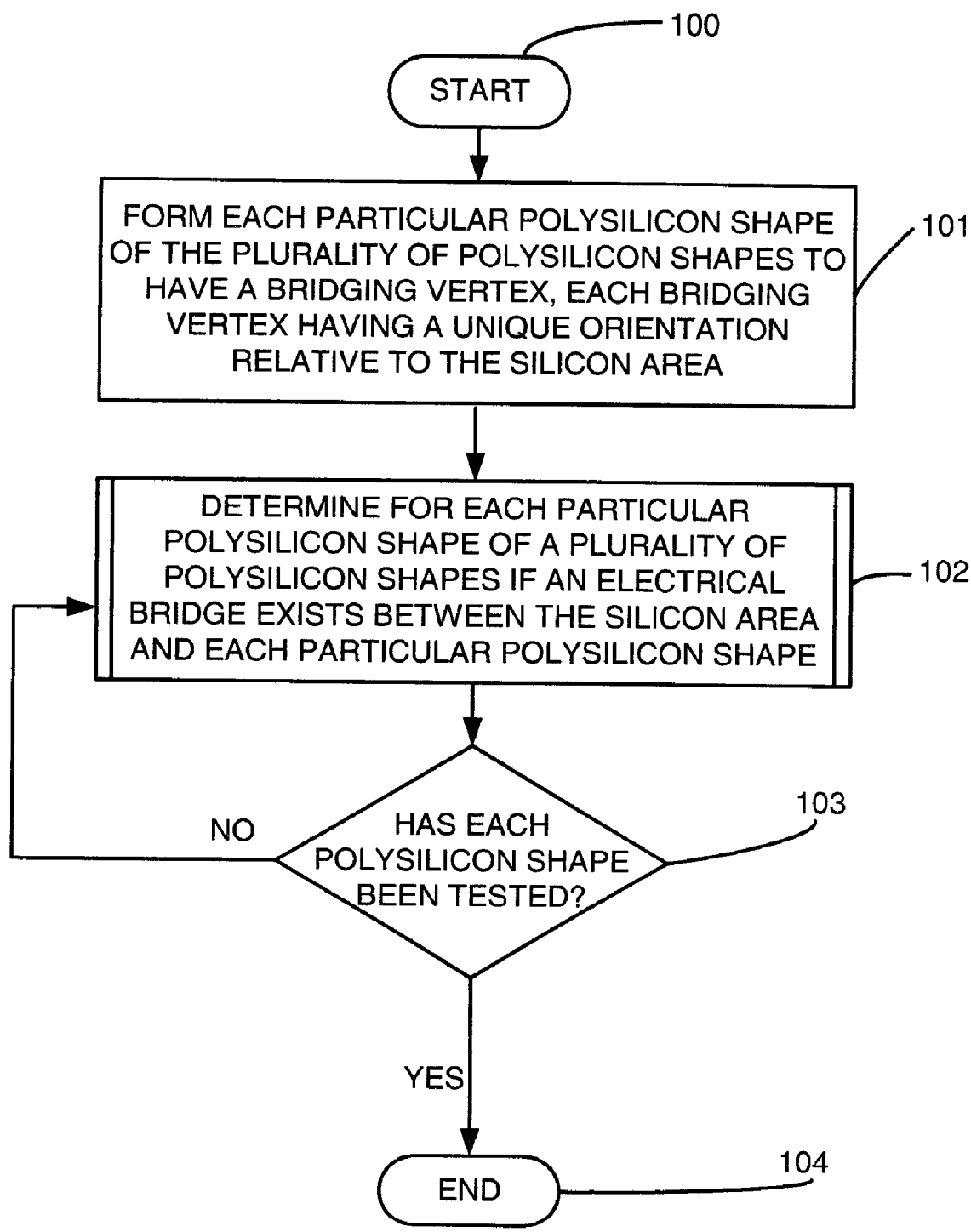
FIGS. 13A and 13B is a flow chart describing a method for measuring bias and misalignment of polysilicon shapes relative to a silicon area.

The following teaches an embodiment of a measurement method beginning at start step 100 utilizing bridging vertices and shown in FIG. 13A. In a first step 101 of a method of measuring alignment of a plurality of polysilicon shapes to a silicon area, a plurality of polysilicon shape pairs are formed, and each polysilicon shape in the plurality of polysilicon shapes has a bridging vertex. Furthermore, each bridging vertex has a unique orientation relative to the silicon area. In a second step 102, it is determined for each polysilicon shape if an electrical bridge exists between the polysilicon shape and the silicon area. The measurement tests are repeated as indicated by 103 until all polysilicon shape pairs have been tested. The method ends at step 104.

Figure 13B:
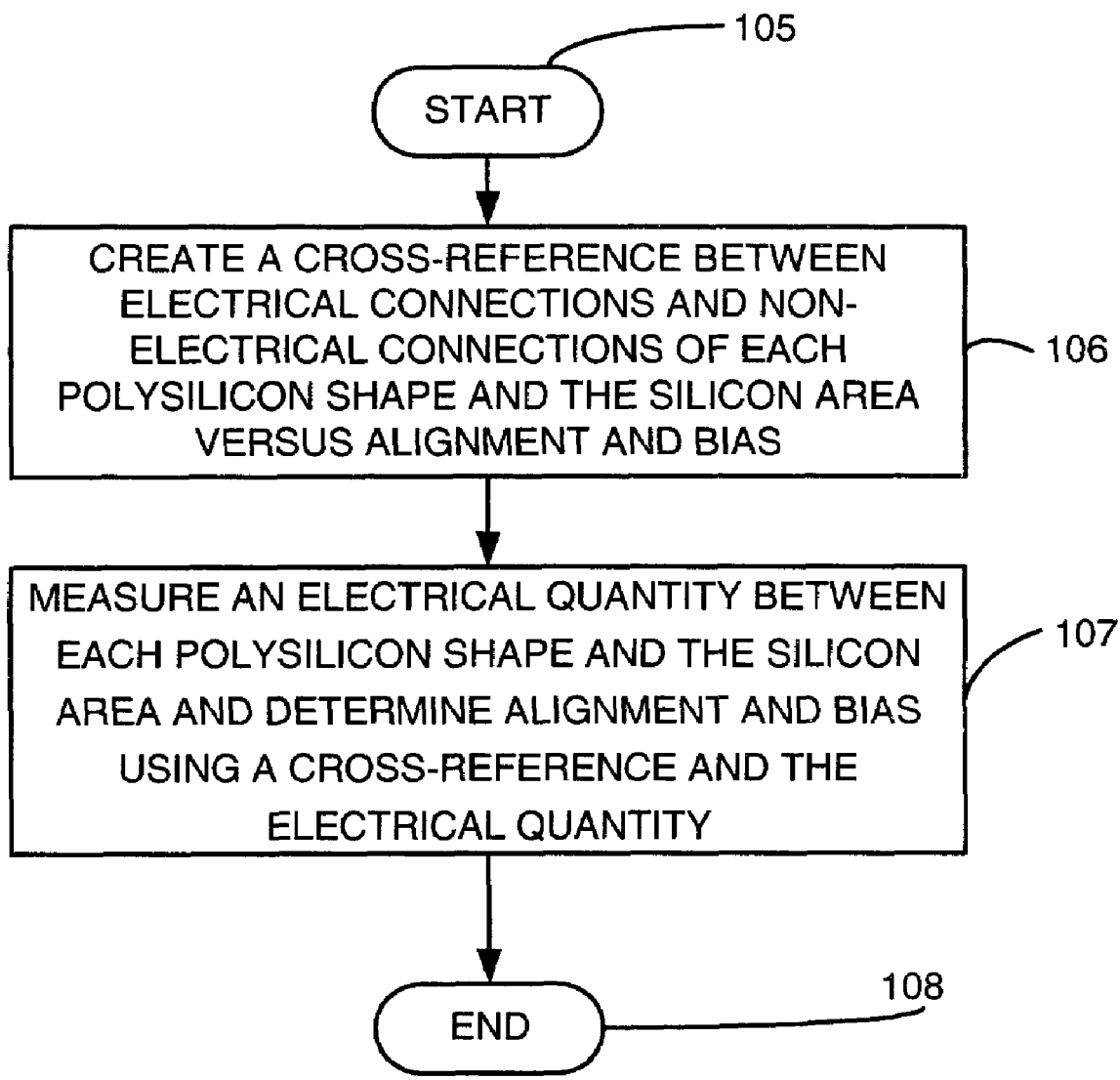

Step 102 is further comprised of two additional substeps as indicated in FIG. 13B. A start step 105 begins the submethod. In a first step 106, a cross-reference is created between electrical connections and non-electrical connections of each polysilicon shape and the silicon area versus alignment and bias. In a second step 107, an electrical quantity is measured between each polysilicon shape and the silicon area, which may be resistance, voltage, current, or any other electrical property. Alignment and bias are determined using the cross-reference and the electrical quantity. The method ends at step 108.

FIG. 14 is a method beginning at step 200 for forming an electrical coupling between a polysilicon shape and a silicon area on a semiconductor chip. In a step 201, a polysilicon shape having a bridging vertex is formed. Electrical couplings between silicon areas and polysilicon shapes may only be created when a bridging vertex is created over the silicon area. The bridging vertex is formed when a portion of the polysilicon shape has an angle less than or equal to a critical angle. The critical angle ensures that the spacer width will be sufficiently small enough near the bridging vertex to create an electrical bridge between the polysilicon shape and the silicon area. In a second step 202, a spacer is formed on vertical sides of the polysilicon shape. The spacer serves as an insulating layer between the polysilicon shape and the silicon area when a silicide is applied in a subsequent step. Wherever a spacer is present, electrical couplings will not be formed between the silicon area and the polysilicon shape. In a third step 203, silicide is created on the polysilicon shape and the silicon area. Where spacers are present, no electrical couplings may occur, but electrical couplings will be created between the polysilicon shape and the silicon area at the bridging vertex where the spacer width is sufficiently small and silicide has been applied. Step 204 ends the method.

What is claimed is:

1. An apparatus for measuring bias of a silicon area comprising:
    a first plurality of polysilicon shapes, wherein each polysilicon shape of the first plurality of polysilicon shapes is formed having a bridging vertex positioned near the silicon area;
    a second plurality of polysilicon shapes, wherein each polysilicon shape of the second plurality of polysilicon shapes is formed having a bridging vertex positioned near the silicon area and positioned generally opposed to the first plurality of polysilicon shapes; and
    wherein each plurality of polysilicon shapes may be used to detect a first quantity of electrical shorts when bias is not present and may be used to detect a second quantity of electrical shorts when a bias is present, the second quantity of shorts differing from the first quantity of shorts; and wherein a bridging vertex is a portion of a particular polysilicon shape on a semiconductor chip, the portion having an angle, as seen from a top view, acute enough to prevent a sidewall spacer being formed on a vertical surface of the particular polysilicon shape at the bridging vertex during a step of processing the semiconductor chip having the plurality of polysilicon shapes, including the particular polysilicon shape, and the silicon area, thereby allowing silicide to form on the vertical surface of the particular polysilicon shape at the bridging vertex in a silicide step performed during processing of the semiconductor chip.

2. The apparatus of claim 1 wherein the second quantity of electrical shorts is greater than the first quantity of electrical shorts when the bias results in a silicon area larger than a silicon area having nominal bias.

3. The apparatus of claim 1 wherein the second quantity of electrical shorts is less than the first quantity of electrical shorts when the bias results in a silicon area smaller than a silicon area having nominal bias.

* * * * *